(12) United States Patent
Li et al.

(10) Patent No.: US 10,502,791 B1
(45) Date of Patent: Dec. 10, 2019

(54) SYSTEM FOR DETERMINING AN ACCURATE OHMIC RESISTANCE VALUE ASSOCIATED WITH A BATTERY CELL

(71) Applicant: LG Chem, Ltd., Seoul (KR)

(72) Inventors: Xueyan Li, Troy, MI (US); Kirk Stetzel, Auburn Hills, MI (US); Chris Boylan, Sunnyvale, CA (US); Nan Cao, Troy, MI (US)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/120,667

(22) Filed: Sep. 4, 2018

(51) Int. Cl.
*G01R 31/389* (2019.01)
*G01R 31/367* (2019.01)
*H01L 21/00* (2006.01)

(52) U.S. Cl.
CPC ......... *G01R 31/389* (2019.01); *G01R 31/367* (2019.01)

(58) Field of Classification Search
CPC ....... H01L 21/00; H01L 2221/00; G06T 1/00; G06T 2200/00; G06F 1/00; G06F 2101/00; G06K 1/00; G06K 2207/00
See application file for complete search history.

(56) References Cited

U.S. PATENT DOCUMENTS

| | | | |
|---|---|---|---|
| 8,730,268 B2 * | 5/2014 | Zwart | G06T 1/00 345/418 |
| 2004/0001996 A1 * | 1/2004 | Sugimoto | G01R 19/16542 429/61 |
| 2012/0293627 A1 * | 11/2012 | Ishii | G06T 3/4007 348/46 |
| 2016/0372942 A1 * | 12/2016 | Marinov | H02J 7/0021 |
| 2017/0003351 A1 * | 1/2017 | Mayr | G01R 31/392 |
| 2017/0080809 A1 * | 3/2017 | Lee | B60L 58/20 |

FOREIGN PATENT DOCUMENTS

JP  2015135277 A  7/2015

* cited by examiner

*Primary Examiner* — Huy Q Phan
*Assistant Examiner* — Temilade S Rhodes-Vivour
(74) *Attorney, Agent, or Firm* — Buckert Patent & Trademark Law Firm PC; John F. Buckert

(57) ABSTRACT

A system for determining an accurate ohmic resistance value associated with a battery cell is provided. The system includes a microprocessor and a memory device. The memory device has a 3-D interpolation table with first, second, third, fourth, fifth, sixth, seventh, and eighth records, each having a respective SOC value, a respective temperature value, a respective current value, and a respective ohmic resistance value. The microprocessor performs a 3-D interpolation calculation based on a first SOC value, a first temperature value, and a first current value and each respective SOC value, each respective temperature value, and each respective current value in the records to determine the accurate ohmic resistance value associated with the battery cell.

14 Claims, 7 Drawing Sheets

| SOC/% | TEMP/oC | CURRENT/A | R0/MILLI-OHMS |
|---|---|---|---|
| 35.00 | 0.00 | 25.00 | 14.06 |
| 35.00 | 0.00 | 50.00 | 13.46 |
| 35.00 | 10.00 | 25.00 | 7.59 |
| 35.00 | 10.00 | 50.00 | 7.50 |
| 55.00 | 0.00 | 25.00 | 13.32 |
| 55.00 | 0.00 | 50.00 | 12.86 |
| 55.00 | 10.00 | 25.00 | 7.61 |
| 55.00 | 10.00 | 50.00 | 7.42 |

SYSTEM FOR DETERMINING AN ACCURATE OHMIC RESISTANCE VALUE ASSOCIATED WITH A BATTERY CELL

BACKGROUND

The inventors herein have recognized a need for an improved system for determining an accurate ohmic resistance value associated with a battery cell. One of the main elements of an equivalent circuit model of a battery cell that is used to represent an electrical response of the battery cell to a flowing electrical current is the DC ohmic resistance value R0 (shown in FIG. 2). Pursuant to Ohm's Law, the voltage drop across the ohmic resistance value R0 is a function of the electrical current through the battery cell multiplied by the ohmic resistance value R0. This voltage drop, and associated $i^2R$ power loss, is the power that is unavailable to the intended application of the battery cell. At beginning of life of the battery cell the ohmic resistance value R0 is at a lowest value. However, aging of the battery cell, due to calendar age and electrical current throughput, results in a growing value of the ohmic resistance value R0. Thus, one of the tasks of a battery management system (BMS) is to continuously monitor/estimate the growing value of the ohmic resistance value R0 because of its major impact on the ability of the BMS to deliver power.

Another system does not recognize that an ohmic resistance value associated with an ohmic resistance of a battery cell is dependent on an amount of current flowing through the battery cell. The inventive system determines a more accurate ohmic resistance value by utilizing a 3-D interpolation table having state of charge values, temperature values, current values, and ohmic resistance values.

SUMMARY

A system for determining an accurate ohmic resistance value associated with a battery cell in accordance with an exemplary embodiment is provided. The system includes a current sensor generating a current signal indicative of an electrical current amplitude of an electrical current flowing through the battery cell. The system further includes a voltage sensor generating a voltage signal indicative of a voltage level of the battery cell. The system further includes a temperature sensor generating a temperature signal indicative of a temperature level of the battery cell. The system further includes a microprocessor determining a first current value based on the current signal, a first voltage value based on the voltage signal, a first temperature value based on the temperature signal, and a first SOC value based on a battery cell capacity value, the first voltage value and the first temperature value. The system further includes a memory device having a 3-D interpolation table stored therein. The 3-D interpolation table has at least first, second, third, fourth, fifth, sixth, seventh, and eighth records, and each of the first, second, third, fourth, fifth, sixth, seventh, and eighth records has a respective SOC value, a respective temperature value, a respective current value, and a respective ohmic resistance value. The microprocessor performs a 3-D interpolation calculation based on the first SOC value, the first temperature value, the first current value, and each respective SOC value, each respective temperature value, and each respective current value in the first, second, third, fourth, fifth, sixth, seventh, and eighth records in the 3-D interpolation table to determine the accurate ohmic resistance value associated with the battery cell.

DETAILED DESCRIPTION

Figure 1:
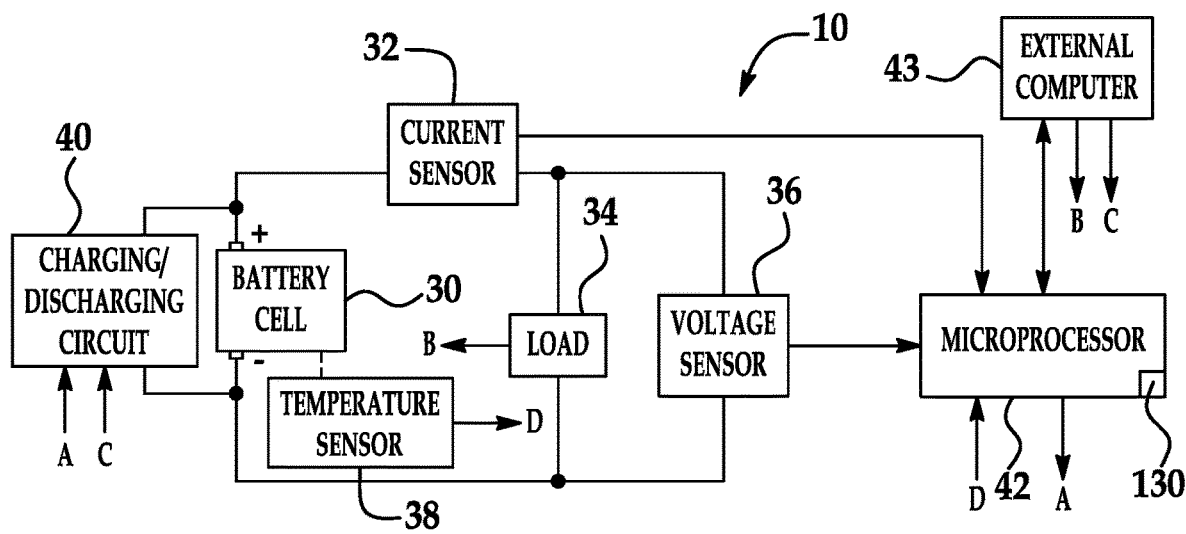
FIG. 1 is a schematic of a system for determining an accurate ohmic resistance value associated with a battery cell in accordance with an exemplary embodiment.

Referring to FIG. 1, a system 10 for determining an accurate ohmic resistance value associated with a battery cell 30 in accordance with an exemplary embodiment is provided. The system 10 includes the battery cell 30, a current sensor 32, an electrical load 34, a voltage sensor 36, a temperature sensor 38, a charging/discharging circuit 40, a microprocessor 42, and an external computer 43. An advantage of the system 10 is that the system 10 determines an accurate ohmic resistance value by utilizing a 3-D interpolation table 200 (shown in FIG. 4) having state of charge values, temperature values, current values, and ohmic resistance values.

The term "state-of-charge" referred to as SOC herein is the equivalent of a fuel gauge for a battery cell. The units of SOC are percentage points (0%=empty; 100%=full).

The term "battery cell capacity" is a measure (typically in Amp-hours) of the charge stored by the battery, and is determined by the mass of active material contained in the battery. The battery cell capacity represents the maximum amount of energy that can be extracted from the battery under certain specified conditions.

The term "accurate value" means±10% of an actual value.

Figure 2:
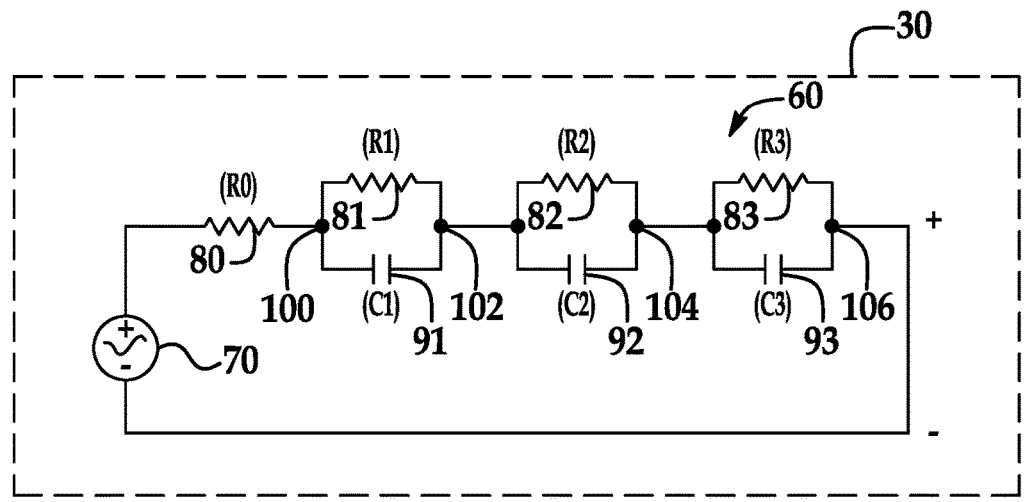
FIG. 2 is an exemplary schematic of a battery cell equivalent circuit model associated with a battery cell utilized in the system of FIG. 1.

Referring to FIGS. 1 and 2, the battery cell 30 includes a positive terminal (+) and a negative terminal (−). In an exemplary embodiment, the battery cell 30 is a pouch-type lithium-ion battery cell. Of course, in an alternative embodiment, other types of battery cells could be utilized. The battery cell 30 is mathematically modeled utilizing the battery cell equivalent circuit model 60 having a voltage source 70, resistors 80, 81, 82, 83, capacitors 91, 92, 93, and electrical nodes 100, 102, 104, 106.

The resistor 80 is coupled between the voltage source 70 and the electrical node 100. The resistor 81 and the capacitor 91 are electrically coupled parallel to one another between the electrical nodes 100, 102. The resistor 82 and the capacitor 92 are electrically coupled parallel to one another between the electrical nodes 102, 104. The resistor 83 and the capacitor 93 are electrically coupled parallel to one another between the electrical nodes 104, 106. The electrical node 106 is further coupled to the voltage source 70.

The resistor 80 has a resistance value R0 corresponding to an internal ohmic resistance value of the battery cell 30. The resistor 81 has a resistance value R1 corresponding to a first time-varying resistance value of the battery cell 30. The resistor 82 has a resistance value R2 corresponding to a second time-varying resistance value of the battery cell 30. The resistor 83 has a resistance value R3 corresponding to a third time-varying resistance value of the battery cell 30. The capacitor 91 has a capacitance value C1 corresponding to a first time-varying capacitance of the battery cell 30. The capacitor 92 has a capacitance value C2 corresponding to a second time-varying capacitance of the battery cell 30. The capacitor 93 has a capacitance value C3 corresponding to a third time-varying capacitance of the battery cell 30. The total steady state resistance of the battery cell equivalent circuit model 60 is R0+R1+R2+R3.

Figure 3:
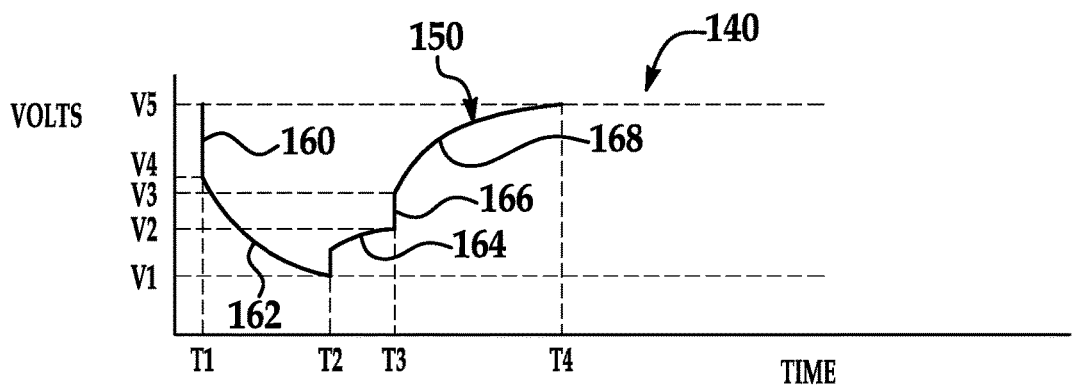
FIG. 3 is a graph of a voltage curve associated with the battery cell utilized in the system of FIG. 1 illustrating first and second discharge curve portions, a relaxation curve portion, and first and second charge curve portions.

Referring to FIGS. 2 and 3, a brief explanation of a graph 140 illustrating a voltage curve 150 associated with the battery cell 30 will be provided. The voltage curve 150 includes a discharge curve portion 160, a discharge curve portion 162, a relaxation curve portion 164, a charge curve portion 166, and a charge curve portion 168. At time T1, when the battery cell 30 is being discharged, the discharge curve portion 150 illustrates the voltage drop across the resistor 80 of the battery cell 30. From time T1 to T2, as the battery cell continues to be discharged, the capacitance values C1, C2, C3 of the capacitors 91, 92, 93, respectively, and the resistance values R1, R2, R3 of the resistors 81, 82, 83, respectively, dictate the shape of the discharge curve portion 162. At time T2, the battery cell 30 has a saturation state and the capacitors 91, 92, 93 have an open operational state, and the battery cell 30 has an internal resistance corresponding to a sum of the resistance values R0, R1, R2, R3. From time T2 to T3, the battery cell 30 is no longer being discharged, and the relaxation curve portion 164 illustrates the voltage across the battery cell 30 nearly instantaneously increases and thereafter gradually increases. At time T3, an external charging voltage is applied to the battery cell 30 and the charge curve portion 166 illustrates the voltage gain across the resistor 80 of the battery cell 30. From time T3 to T4, the battery cell 30 is being charged, and capacitance values C1, C2, C3 of the capacitors 91, 92, 93, respectively, and the resistance values R1, R2, R3 of the resistors 81, 82, 83 respectively, dictate the shape of the discharge curve portion 162.

Referring to FIG. 1, the current sensor 32 is electrically coupled in series between the positive terminal of the battery cell 30 and the electrical load 34. The current sensor 32 is adapted to generate a signal having a current value therein that indicates a current level flowing through the battery cell 32, which is received by the microprocessor 42.

The electrical load 34 is electrically coupled between the current sensor 32 and the negative terminal of the battery cell 30. In an exemplary embodiment, the electrical load is an electric motor in which the operation (e.g., speed, torque etc.) of the electric motor is controlled by the external computer 43.

The voltage sensor 36 is electrically coupled in parallel with the electrical load 34. The voltage sensor 36 is adapted to generate a signal having a voltage value therein that indicates a voltage across the battery cell 30, which is received by the microprocessor 42.

The temperature sensor 38 is disposed proximate to the battery cell 30. In an exemplary embodiment, the temperature sensor 38 is disposed on an external surface of the battery cell 30. The temperature sensor 38 is adapted to generate a signal having a cell temperature value therein that indicates a temperature level of the battery cell 30, which is received by the microprocessor 42.

The charging/discharging circuit 40 is provided to apply a charging current across the battery cell 30 to electrically charge the battery cell 30 in response to a control signal from the microprocessor 42. Further, the charging/discharging circuit 40 is provided to discharge the battery cell 30 in response to another control signal from the microprocessor 42. The charging/discharging circuit 40 is electrically coupled between the positive terminal of the battery cell 30 and the negative terminal of the battery cell 30.

The microprocessor 42 is electrically coupled to the current sensor 32, the voltage sensor 36, and the temperature sensor 38. The microprocessor 42 operably communicates with the external computer 43 via a communication bus. The microprocessor 42 includes a memory device 130 for storing data, tables, and software instructions for implementing at least a portion of the methods described hereinafter.

Figures 4, 5:
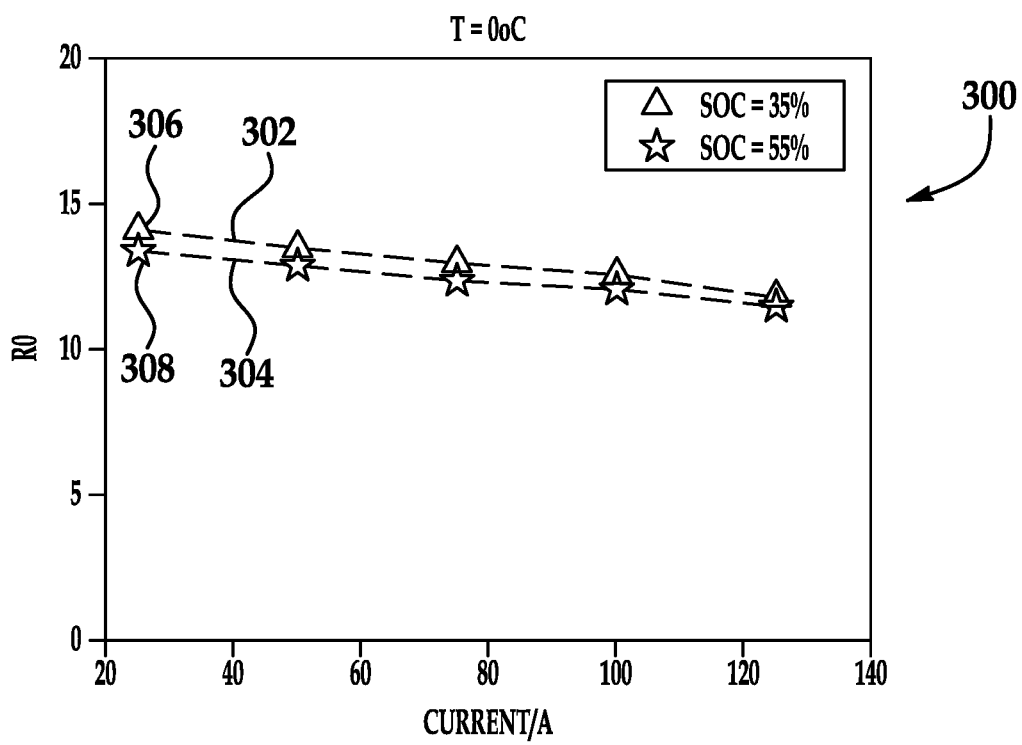
FIG. 4 is a 3-D interpolation table utilized by the system of FIG. 1.
FIG. 5 is an empirically determined graph having a first curve of ohmic resistance values versus current values at a first state-of-charge (SOC) value, and a second curve of ohmic resistance values versus the current values at a second SOC value.

Referring to FIG. 4, a description of an exemplary 3-D interpolation table 200 utilized by the system of FIG. 1 will now be explained. The 3-D interpolation table 200 includes records 202, 204, 206, 208, 210, 212, 214, 216.

The record 202 includes an SOC value of 35%, a temperature value of 0 degrees C., a current value of 25 amps, and an ohmic resistance value of 14.06%.

The record 204 includes an SOC value of 35%, a temperature value of 0 degrees C., a current value of 50 amps, and an ohmic resistance value of 13.46%.

The record 206 includes an SOC value of 35%, a temperature value of 10 degrees C., a current value of 25 amps, and an ohmic resistance value of 7.59%.

The record 208 includes an SOC value of 35%, a temperature value of 10 degrees C., a current value of 50 amps, and an ohmic resistance value of 7.5%.

The record 210 includes an SOC value of 55%, a temperature value of 0 degrees C., a current value of 25 amps, and an ohmic resistance value of 13.32%.

The record 212 includes an SOC value of 55%, a temperature value of 0 degrees C., a current value of 50 amps, and an ohmic resistance value of 12.86%.

The record 214 includes an SOC value of 55%, a temperature value of 10 degrees C., a current value of 25 amps, and an ohmic resistance value of 7.61%.

The record 216 includes an SOC value of 55%, a temperature value of 10 degrees C., a current value of 50 amps, and an ohmic resistance value of 7.42%.

The values in the 3-D interpolation table 200 are empirically determined. In particular, the values in the 3-D interpolation table 200 are empirically determined by holding one of the values constant (one of an SOC value, a temperature value, a current value), and then varying one of the other values over time to determine an ohmic resistance value curve associated with the resistor 80 in the battery cell equivalent circuit model 60.

Referring to FIGS. 5-10, some graphs having empirically determined curves utilized to determine the values in the 3-D interpolation table 200 will now be described.

Referring to FIG. 5, an empirically determined graph 300 having a first curve 302 of ohmic resistance values versus current values at a first state-of-charge (SOC) value, and a second curve 304 of ohmic resistance values versus the current values at a second SOC value is illustrated. The coordinate point 306 corresponds to the values in records 202 and 204 of the table 200. Further, the coordinate points 308 and 304 corresponds to the values in records 210 and 212 of the table 200.

Figure 6:
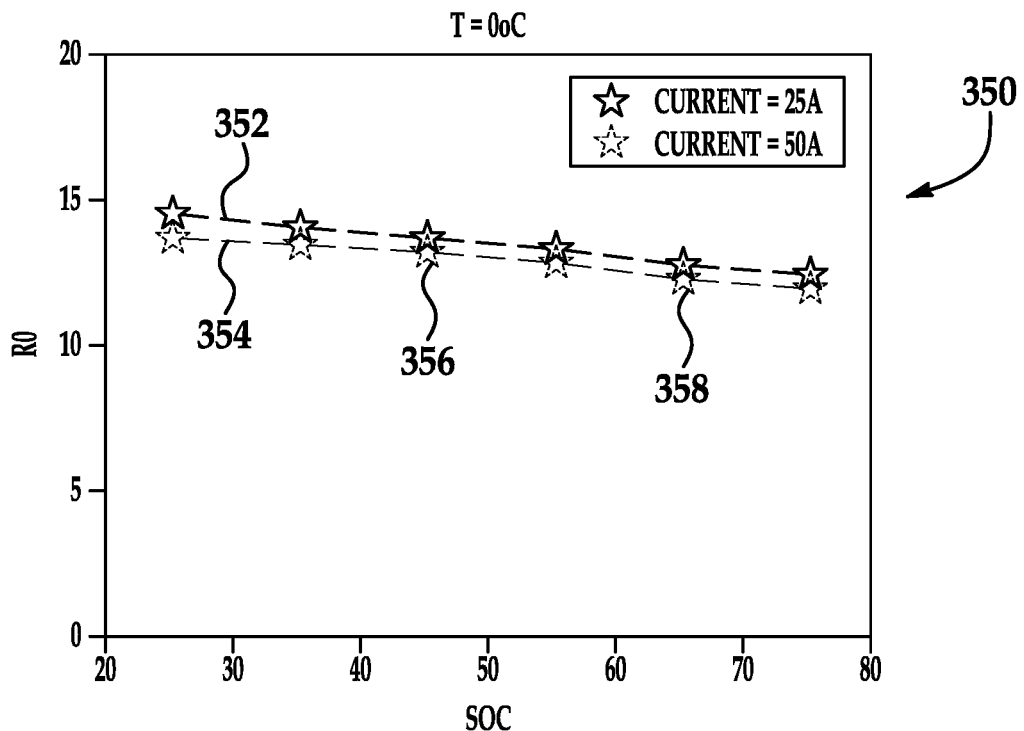
FIG. 6 is an empirically determined graph having a first curve of ohmic resistance values versus state-of-charge (SOC) values at a first current value, and a second curve of ohmic resistance values versus the SOC values at a second current value.

Referring to FIG. 6, an empirically determined graph 350 having a first curve 352 of ohmic resistance values versus SOC values at a first current value, and a second curve 354 of ohmic resistance values versus the SOC values at a second current value is illustrated. The coordinate point 356 corresponds to the values in record 204 of the table 200. Further, the coordinate point 358 corresponds to the values in record 212 of the table 200.

Figure 7:
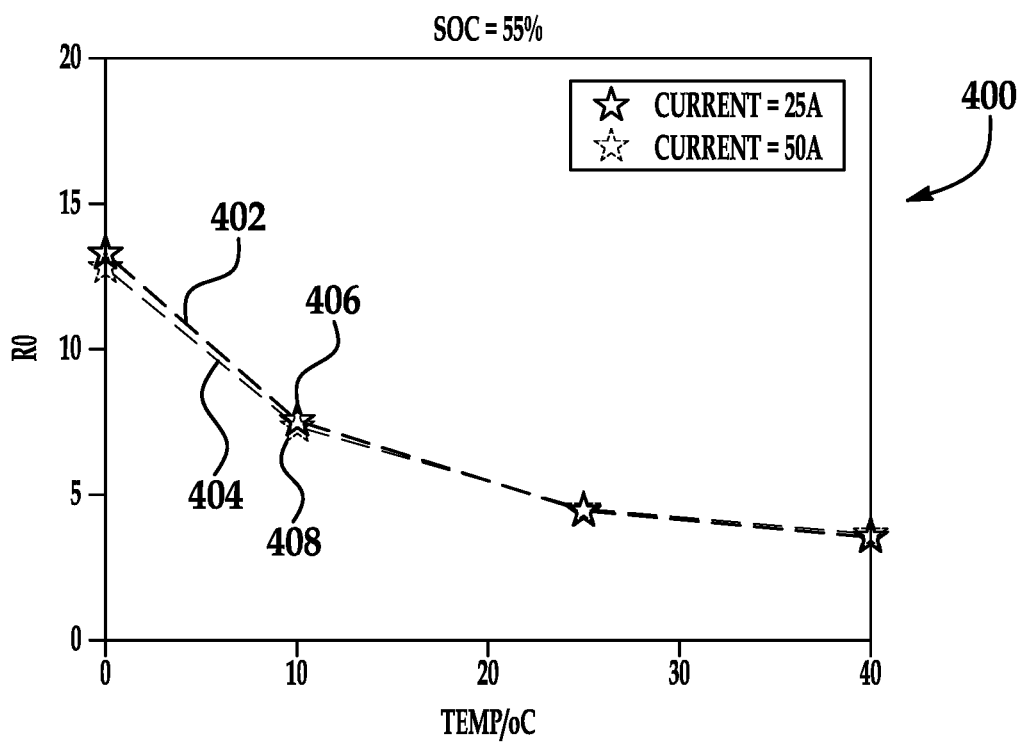
FIG. 7 is an empirically determined graph having a first curve having ohmic resistance values versus temperature values at a first current value, and a second curve of ohmic resistance values versus the temperature values at a second current value.

Referring to FIG. 7, an empirically determined graph 400 having a first curve 402 having ohmic resistance values versus temperature values at a first current value, and a second curve 404 of ohmic resistance values versus the temperature values at a second current value is illustrated. The coordinate point 406 corresponds to the values in record 214 of the table 200. Further, the coordinate point 408 corresponds to the values in record 216 of the table 200.

Figure 8:
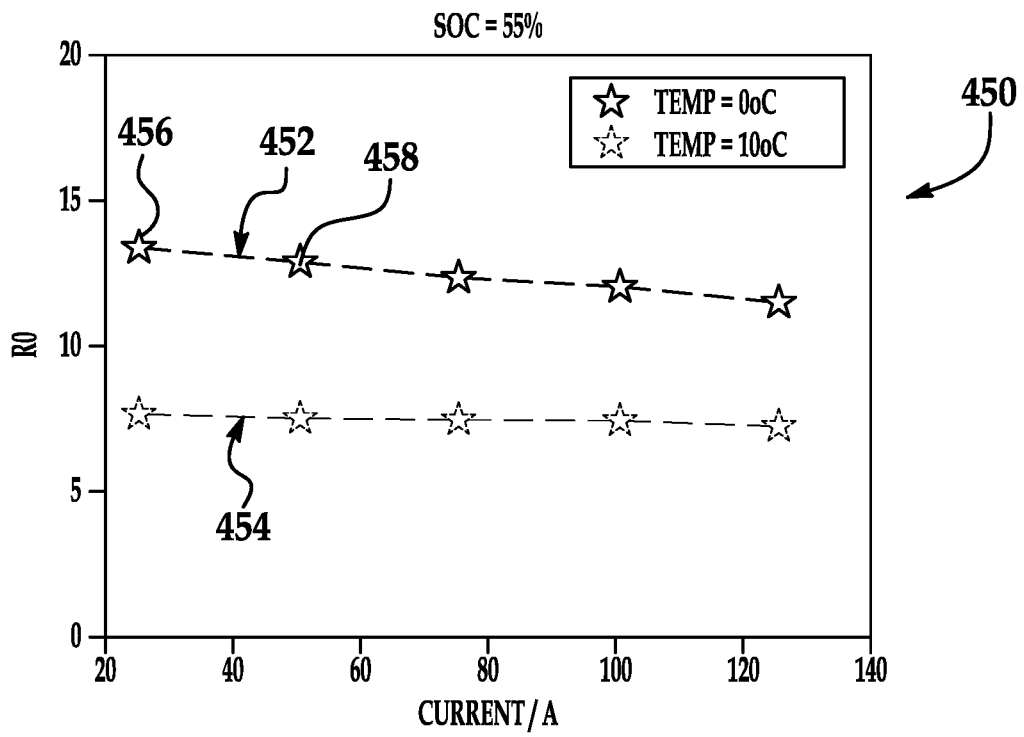
FIG. 8 is an empirically determined graph having a first curve of ohmic resistance values versus current values at a first temperature value, and a second curve of ohmic resistance values versus the current values at a second temperature value.

Referring to FIG. 8, an empirically determined graph 450 having a first curve 452 of ohmic resistance values versus current values at a first temperature value, and a second curve 454 of ohmic resistance values versus the current values at a second temperature value is illustrated. The coordinate point 456 corresponds to the values in record 210 of the table 200. Further, the coordinate point 458 corresponds to the values in record 212 of the table 200.

Figure 9:
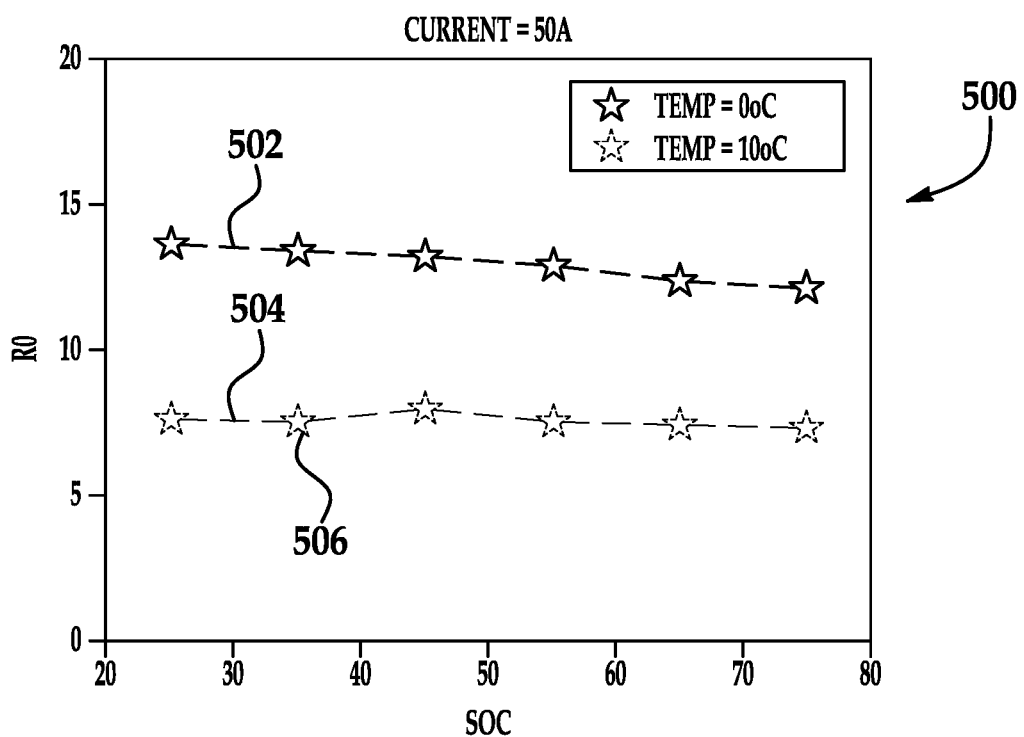
FIG. 9 is an empirically determined graph having a first curve of ohmic resistance values versus SOC values at a first temperature value, and a second curve of ohmic resistance values versus the SOC values at a second temperature value.

Referring to FIG. 9, an empirically determined graph 500 having a first curve 502 of ohmic resistance values versus SOC values at a first temperature value, and a second curve 504 of ohmic resistance values versus the SOC values at a second temperature value is illustrated. The coordinate point 506 corresponds to the values in record 208 of the table 200.

Figure 10:
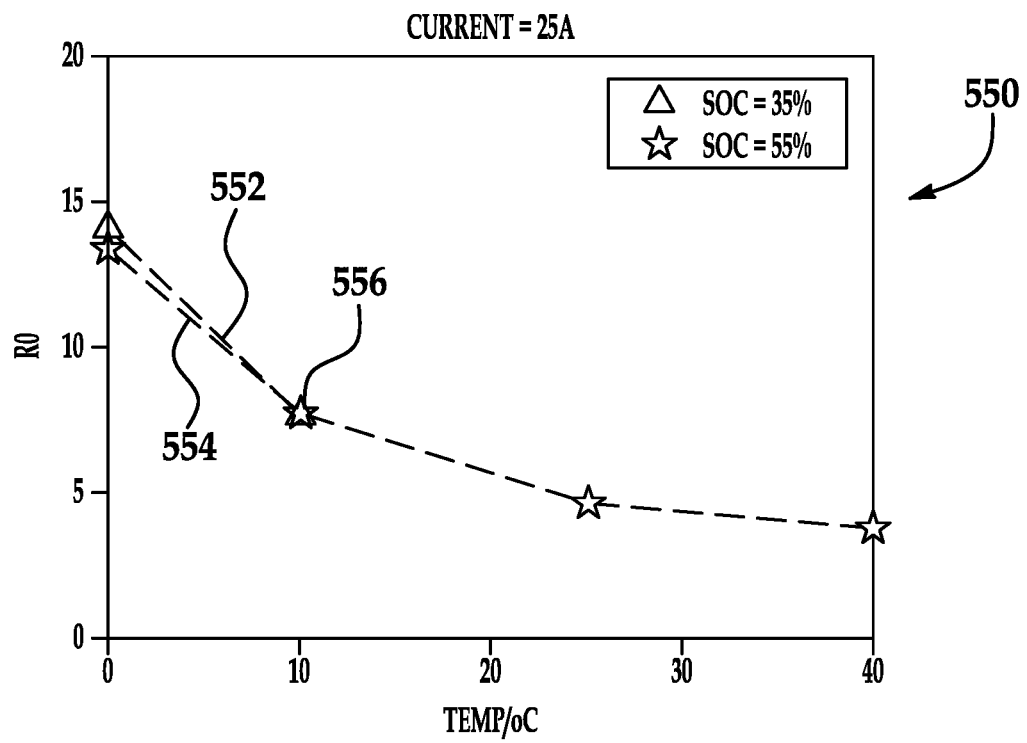
FIG. 10 is an empirically determined graph having a first curve of ohmic resistance values versus temperature values at a first SOC value, and a second curve of ohmic resistance values versus the temperature values at a second SOC value.

Referring to FIG. 10, an empirically determined graph 550 having a first curve 552 of ohmic resistance values versus temperature values at a first SOC value, and a second curve 554 of ohmic resistance values versus the temperature values at a second SOC value is illustrated. The coordinate point 556 corresponds to the values in record 206 of the table 200.

A general overview of a 3-D interpolation equation that is utilized to determine an accurate ohmic resistance value associated with the battery cell 30 will now be provided.

The 3-D interpolation equation has the following characteristics:

The known values are x, y, z, $x_0$, $y_0$, $z_0$, $x_1$, $y_1$, $z_1$ and the values at the following positions:

$$f_{000}=f(x_0,y_0,z_0); f_{100}(x_1,y_0,z_0); \ldots ; f_{111}=f_{111}(x_1,y_1,z_1);$$

Set $r_x=(x-x_0)/(x_1-x_0);$ $r_y=(y-y_0)/(y_1-y_0);$ $r_z=(z-z_0)/(z_1-z_0);$

Figure 11:
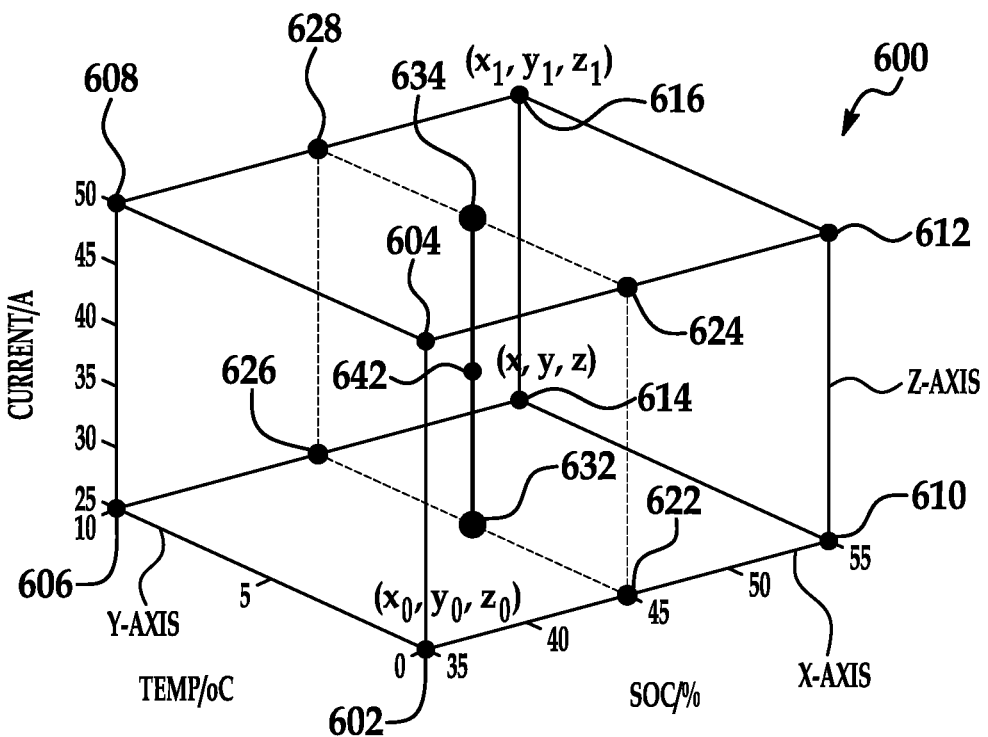
FIG. 11 is a schematic of a 3-D coordinate system wherein each coordinate point therein has an associated SOC value, a temperature value, a current value, and an ohmic resistance value.

Then $f(x,y,z)=f_{000}(1-r_x)(1-r_y)(1-r_z)+$ $f_{100}(1-r_y)(1-r_y)(1-r_z)+f_{010}(1-r_x)r_y(1-r_z)+f_{001}(1-r_x)(1-r_y)r_z+$ $f_{101}r_x(1-r_y)r_z+f_{011}(1-r_x)r_yr_z+f_{110}r_xr_y(1-r_z)+f_{111}r_xr_yr_z$ In particular, the variables x, y, z correspond to an associated SOC value, temperature value, and current value, respectively, at a specific location in a 3-D coordinate system 600 shown in FIG. 11.

The term "f(x,y,z)" corresponds to an R0 ohmic resistance value at a specific SOC value, temperature value, and current value.

Referring to FIG. 11, a schematic of the 3-D coordinate system 600 wherein each coordinate point therein has an associated SOC value, a temperature value, a current value, and an ohmic resistance value is illustrated. The 3-D coordinate system 600 and associated coordinate points therein will be explained in greater detail below to give a graphical understanding of how the 3-D interpolation equation discussed above determines the accurate ohmic resistance values by interpolating between eight coordinate points. The 3-D coordinate system 600 includes coordinate points 602, 604, 606, 608, 610, 612, 614, 616 that define a 3-D space within the 3-D coordinate system 600 and correspond to records 202, 204, 206, 208, 210, 212, 214, 216, respectively, in the table 200.

Figure 12:
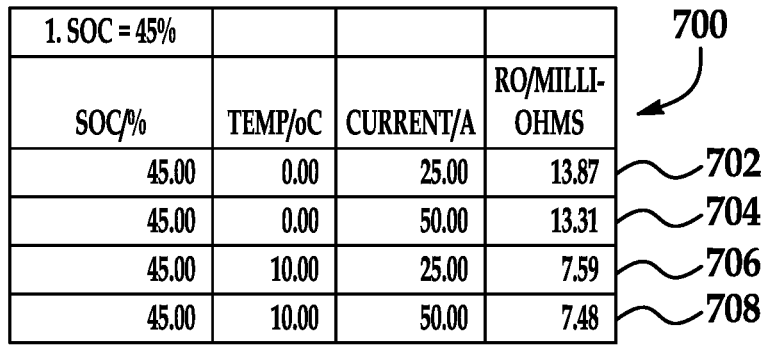
FIG. 12 is a table indicating four coordinate points in the 3-D coordinate system of FIG. 11 when the SOC value is constrained at 45%.

Referring to FIG. 12, a table 700, derived from the table 200, indicates four coordinate points in the 3-D coordinate system of FIG. 11 wherein each coordinate point has an associated SOC value, a temperature value, a current value, and an ohmic resistance value, when the SOC value is constrained at 45%. In particular, table 700 includes records 702, 704, 706, 708. The record 702 corresponds to coordinate point 622, and the record 704 corresponds to the coordinate point 624. Further, the record 706 corresponds to coordinate point 626, and the record 708 corresponds to the coordinate point 628. The points 622, 624, 626, 628 define a plane.

Figure 13:
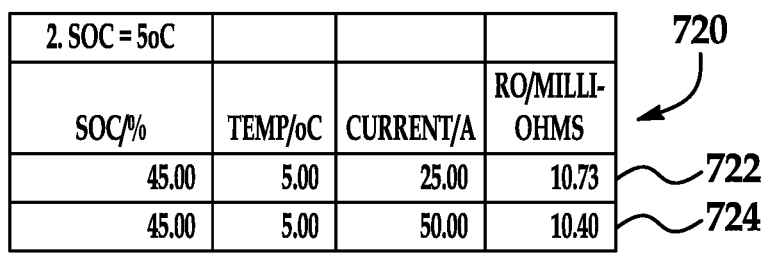
FIG. 13 is a table indicating two coordinate points in the 3-D coordinate system of FIG. 11 when the SOC value is constrained at 45% and the temperature value is constrained at 5 degrees C.

Referring to FIG. 13, a table 720, derived from the table 200, indicates two coordinate points in the 3-D coordinate system 600 of FIG. 11 when the SOC value is constrained at 45% and the temperature value is constrained at 5 degrees C. In particular, the table 720 includes records 722, 724. The record 722 corresponds to coordinate point 632, and the record 724 corresponds to the coordinate point 634. The points 632, 634 define a line therebetween.

Figure 14:
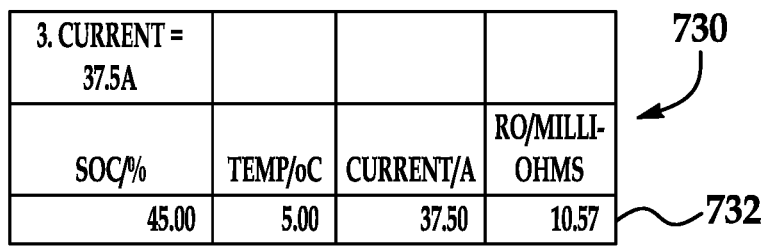
FIG. 14 is a table indicating one coordinate point in the 3-D coordinate system of FIG. 11 when the SOC value is constrained at 45%, and the temperature value is constrained at 5 degrees C., and the current value is constrained at 37.5 amps.

Referring to FIG. 14, a table 730, derived from the table 200, indicates one coordinate point in the 3-D coordinate system of FIG. 11 when the SOC value is constrained at 45%, and the temperature value is constrained at 5 degrees C., and the current value is constrained at 37.5 amps. In particular, the table 730 includes a record 732 that corresponds to coordinate point 642 and indicates an ohmic resistance value of 10.57 when the SOC is 45%, the temperature is 5 degrees C., and the current value is 37.5 amps.

Figure 15:
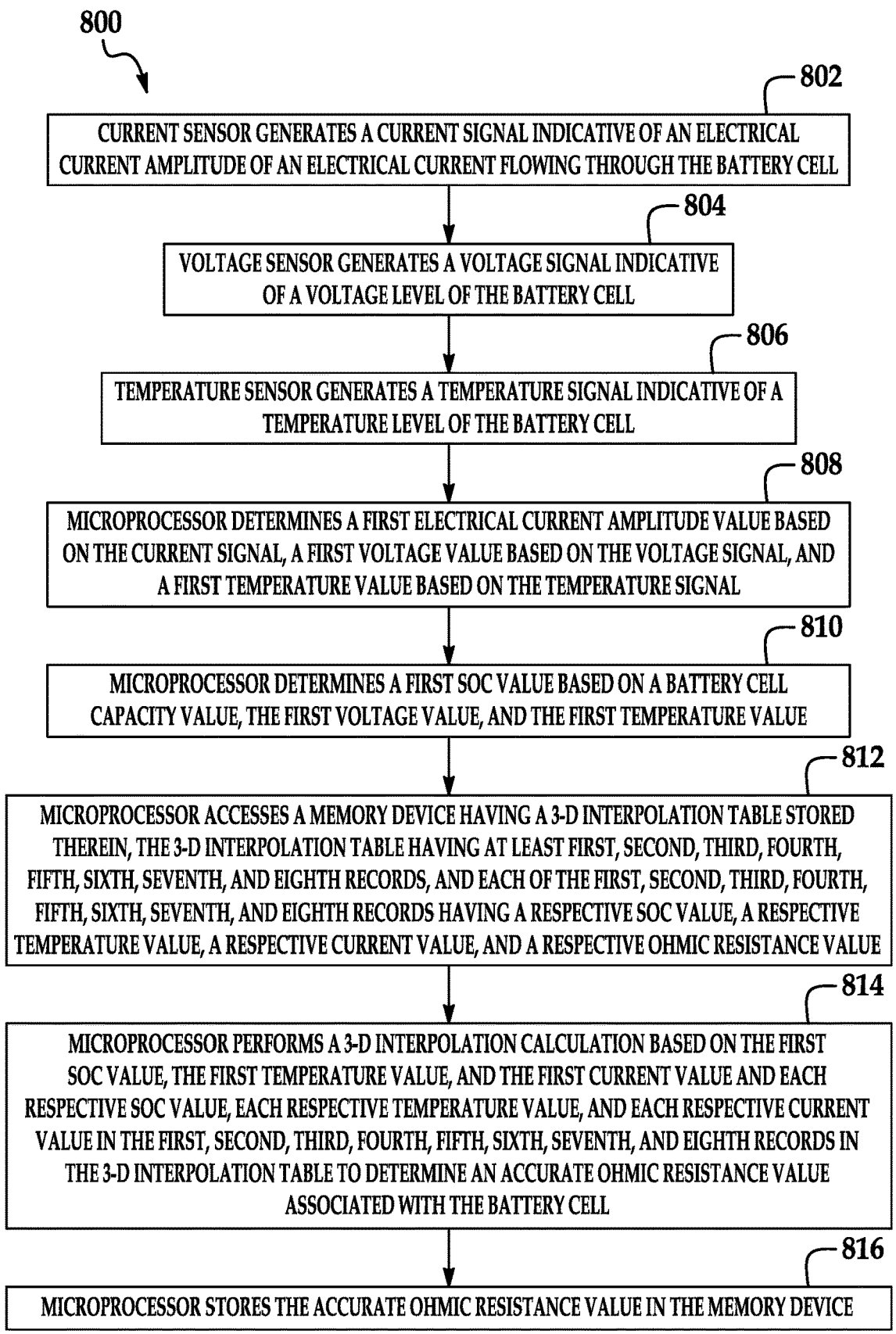
FIG. 15 is a flowchart of a method for determining an accurate ohmic resistance value of a battery cell utilizing the system of FIG. 1.

Referring to FIG. 15, a flowchart 800 of a method for determining an accurate ohmic resistance value associated with the battery cell 30 will now be explained.

At step 802, the current sensor 32 generates a current signal indicative of an electrical current amplitude of an electrical current flowing through the battery cell 30.

At step 804, the voltage sensor 36 generates a voltage signal indicative of a voltage level of the battery cell 30.

At step 806, the temperature sensor 38 generates a temperature signal indicative of a temperature level of the battery cell 30.

At step 808, the microprocessor 42 determines a first electrical current amplitude value based on the current signal, a first voltage value based on the voltage signal, and a first temperature value based on the temperature signal.

At step 810, the microprocessor 42 determines a first SOC value based on a battery cell capacity value, the first voltage value, and the first temperature value. In an exemplary embodiment, the first SOC value is determined utilizing a look-up table in the memory device 130 wherein each record in the look-up table has a battery cell capacity value, a voltage value, a temperature value, and an SOC value.

At step 812, the microprocessor 42 accesses a memory device having a 3-D interpolation table 200 stored therein. The 3-D interpolation table 200 has at least first, second, third, fourth, fifth, sixth, seventh, and eighth records 202, 204, 206, 208, 210, 212, 214, 216 respectively. Each of the first, second, third, fourth, fifth, sixth, seventh, and eighth records 202, 204, 206, 208, 210, 212, 214, 216 has a respective SOC value, a respective temperature value, a respective current value, and a respective ohmic resistance value.

At step 814, the microprocessor 42 performs a 3-D interpolation calculation based on the first SOC value, the first temperature value, and the first current value and each respective SOC value, each respective temperature value, and each respective current value in the first, second, third, fourth, fifth, sixth, seventh, and eighth records 202, 204, 206, 208, 210, 212, 214, 216 in the 3-D interpolation table 200 to determine an accurate ohmic resistance value associated with the battery cell 30. In an exemplary embodiment, the accurate ohmic resistance value corresponds to a coordinate point 642 within a 3-D coordinate system 600.

At step 816, the microprocessor 42 stores the accurate ohmic resistance value in the memory device 130.

The above-described method can be at least partially embodied in the form of one or more memory devices or computer readable media having computer-executable instructions for practicing the method. The memory devices can comprise one or more of the following: hard drives, RAM memory, flash memory, and other computer-readable media known to those skilled in the art; wherein, when the computer-executable instructions are loaded into and executed by one or more microprocessors, the one or more microprocessors become an apparatus programmed to practice the associated steps of the method.

The system described herein provides a substantial advantage over other systems. In particular, the system determines an accurate ohmic resistance value by utilizing a 3-D interpolation table having SOC values, temperature values, current values, and ohmic resistance values.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A system for determining an accurate ohmic resistance value associated with a battery cell, comprising:
a current sensor generating a current signal indicative of an electrical current amplitude of an electrical current flowing through the battery cell;
a voltage sensor generating a voltage signal indicative of a voltage level of the battery cell;
a temperature sensor generating a temperature signal indicative of a temperature level of the battery cell;
a microprocessor determining a first current value based on the current signal, a first voltage value based on the voltage signal, a first temperature value based on the temperature signal, and a first SOC (State-Of-Charge) value based on a battery cell capacity value, the first voltage value and the first temperature value;
a memory device having a 3-D interpolation table stored therein with at least first, second, third, fourth, fifth, sixth, seventh, and eighth records, and each of the first, second, third, fourth, fifth, sixth, seventh, and eighth records having a respective SOC value, a respective temperature value, a respective current value, and a respective ohmic resistance value; and
the microprocessor performing a 3-D interpolation calculation based on the first SOC value, the first temperature value, the first current value, and each respective SOC value, each respective temperature value, and each respective current value in the first, second, third, fourth, fifth, sixth, seventh, and eighth records in the 3-D interpolation table to determine the accurate ohmic resistance value associated with the battery cell.

2. The system of claim 1, wherein the microprocessor storing the accurate ohmic resistance value in a memory device.

3. The system of claim 1, wherein the respective SOC value in the first record is different than the respective SOC value in the second record.

4. The system of claim 1, wherein the respective SOC value in the first record is in a range of 35-55%.

5. The system of claim 1, wherein the respective temperature value in the first record is different than the respective temperature value in the second record.

6. The system of claim 1, wherein the respective temperature value in the first record is in a range of 0-10 degrees Celsius.

7. The system of claim 1, wherein the respective current value in the first record is different than the respective current value in the second record.

8. The system of claim 1, wherein the respective current value in the first record is in a range of 25-50 amps.

9. The system of claim 1, wherein the temperature sensor is disposed on an external surface of the battery cell.

10. The system of claim 1, wherein the voltage sensor is electrically coupled in parallel to the battery cell.

11. The system of claim 1, wherein the current sensor is electrically coupled in series between the battery cell and an electrical load.

12. The system of claim 1, wherein the first, second, third, fourth, fifth, sixth, seventh, and eighth records in the 3-D interpolation table define first, second, third, fourth, fifth, sixth, seventh, and eighth coordinate points, respectively, in a 3-D coordinate system.

13. The system of claim 12, wherein the accurate ohmic resistance value corresponds to a ninth coordinate point within the 3-D coordinate system.

14. The system of claim 13, wherein the ninth coordinate point is in a 3-D space defined by the first, second, third, fourth, fifth, sixth, seventh, and eighth coordinate points in the 3-D coordinate system.

\* \* \* \* \*